United States Patent [19]

Davenport

[11] Patent Number: 4,565,977
[45] Date of Patent: Jan. 21, 1986

[54] EMITTER COUPLED PROGRAMMABLE OSCILLATOR

[75] Inventor: William H. Davenport, Hillsboro, Oreg.

[73] Assignee: Tektronix, Inc., Beaverton, Oreg.

[21] Appl. No.: 683,079

[22] Filed: Dec. 18, 1984

[51] Int. Cl.[4] .......................................... H03K 3/281
[52] U.S. Cl. ................................. 331/113 R; 331/144
[58] Field of Search .................... 331/55, 113 R, 114, 331/144, 145; 330/51

[56] References Cited

FOREIGN PATENT DOCUMENTS 0077564 6/1977 Japan ............................. 331/113 R

*Primary Examiner*—Eugene LaRoche
*Assistant Examiner*—G. Wan
*Attorney, Agent, or Firm*—John P. Dellett

[57] ABSTRACT

A programmable oscillator includes first and second transistors having their emitters coupled by a capacitor, and a pair of current sources coupling respective transistors to ground. A switching means is provided having a first state coupling the collector of the first transistor to the base of the second transistor and coupling the collector of the second transistor to the base of the first transistor, and a second state coupling the collectors of the first and second transistors to ground such that when the switching means is in the first state, the first and second transistors switch on and off in alternating fashion, and when the switching means is in the second state the first and second transistors remain on continuously. Means are provided to hold the base of the first transistor at a high logic level and to hold the base of the second transistor at a low logic level while the first switching means is in the second state, to couple a third current source to the collector of the first transistor while the second transistor is off and to the collector of the second transistor while the first transistor is off, and to prevent the switching means from switching from the first to the second state until the base of the first transistor is at a higher voltage level than the base of the second transistor.

10 Claims, 2 Drawing Figures

EMITTER COUPLED PROGRAMMABLE OSCILLATOR

BACKGROUND OF THE INVENTION

The present invention relates in general to electronic oscillators and in particular to emitter coupled oscillators of the type wherein the frequency and duty cycle of the oscillator are adjustable.

A typical emitter coupled oscillator comprises a matching pair of transistors having emitters coupled by a capacitor. The base of each transistor is coupled in a feedback loop to the collector of the other. An adjustable current source is applied directly to the emitter of one of the transistors and a second adjustable current source is applied through a switch to the second transistor emitter.

Oscillator output is taken at the base of either transistor and oscillation is initiated by switching the second current source from ground to the second transistor emitter. The frequency of oscillation may be increased or reduced by increasing or reducing the current supplied by the current sources. The duty cycle may be altered by changing the amount of current supplied by one current source relative to the other.

Problems are associated with this circuit. First, after switching the second current supply to the emitter of the second transistor, there may be a delay before the oscillator makes its first change of state. The length of the delay depends on the charge on the capacitor at the time the second current supply was switched on. If that charge is different from the charge on the capacitor at the moment the oscillator changes state during steady state oscillation, then there is a delay in switching until the capacitor charge reaches the proper level. The initial delay in oscillator change of state also depends on the magnitude of the second current source. Since the current source may be adjusted to program the oscillator for different operating frequencies and duty cycles, the initial delay in oscillator change of state can vary, making it difficult to synchronize oscillator operation with external events.

Secondly, because the charge on the capacitor at the time the oscillator is switched on may be different from the charge on the capacitor at the moment of oscillator change of state during steady state operation, the cycle times associated with the first few oscillations may be longer or shorter than the steady state cycle time of the oscillator. For instance, if the capacitor has a high initial charge, the first period of oscillation will be long, with subsequent periods being progressively shorter as inherent losses in the oscillator dissipate the excess energy associated with the excess charge until the steady state period is reached.

The traditional emitter coupled oscillator is unable to maintain proper output voltage levels at low frequencies, the frequency of operation and the output voltage levels of the oscillator being dependent on the magnitudes of the current sources. When the current sources are adjusted to a low current output to obtain low frequency oscillator operation, the low current values are not sufficient to support the low logic output levels. Thus the frequency range of the oscillator is limited.

Additionally, at the moment the oscillator is turned off by disconnecting the second current source, the emitter coupling capacitor may be charged to a value other than its steady state, "oscillator off" value and the output voltage signal may incur some transient ringing as the charge on the capacitor settles to its steady state magnitude.

Finally, the last period of the oscillator may be abruptly and prematurely terminated when the oscillator is turned off. In some applications it is desirable that oscillation cease only at the end of a full period of oscillation so that the last period is of the same duration as the first.

What is needed is an emitter coupled oscillator having a minimal and consistent time delay for the first change of state and a minimal transient response when turned on. The oscillator should also have a wide operating frequency range and the ability to stop with minimal transient response at a predetermined point in the oscillation cycle when turned off.

SUMMARY OF THE INVENTION

In accordance with one aspect of the invention, first and second transistors have their emitters coupled through a capacitor and separately adjustable first and second current sources are directly coupled to the emitters of the transistors. Switch means are provided to couple the collector of the first transistor to the base of the second and to couple the collector of the second transistor to the base of the first while the oscillator is operating. When the oscillator is "off", i.e. not oscillating, the switch means couple the transistor collectors to ground. Inverting and noninverting oscillator outputs are taken at the bases of the first and second transistors, while first and second load and level clamps, coupled to the transistor bases, ensure the output voltages do not fall below a low logic level or rise above a selected high logic level.

Means are provided to ensure that when the oscillator is off, the base of the first transistor is switched to a source of high logic level voltage and the base of the second transistor is switched to a source of low logic level voltage. Thus prior to oscillator operation, the base of the first transistor is coupled to a predetermined high logic level voltage and the base of the second transistor is coupled to a predetermined low logic level voltage, while the transistor collectors are grounded. Both transistors are then on, with the voltage across the capacitor coupling the two emitters being substantially equal to the difference between the high and low logic voltage levels on the transistor bases. This voltage is also arranged to be substantially equal to the voltage on the capacitor at the moment of oscillator change of state during steady state oscillator operation.

The oscillator is started by operating switch means to couple the collector of each transistor to the base of the other. Since the charge on the capacitor at the moment the oscillator is started is determined by the logic levels at the transistor bases, and since this charge is very nearly equal to the charge on the capacitor at the moment of oscillator change of state during steady state oscillator operation, the oscillator changes state, following switch means operation, with little delay. Also the first period of oscillation is essentially equal to the steady state period of oscillation because there is little initial excess or deficiency of charge on the capacitor to cause frequency transients when the oscillator is started.

According to another aspect of the invention, means are provided to alternately couple a holding current source to first and second load and level clamps thereby providing additional output voltage pull down current when the currents supplied by the first and second current sources are insufficient to maintain the proper low logic levels at the transistor bases. This permits proper oscillator voltage output when the first and second current sources are adjusted to low current output levels for achieving low frequency oscillation.

According to still another aspect of the invention, means are provided to sense the state of the oscillator and to prevent actuation of the switch means used for stopping oscillator operation until the oscillator is in its off state. Thus the charge on the capacitor at the moment of oscillator turn off is arranged to be approximately equal to its steady state oscillator off value, thereby reducing transient behavior in oscillator output voltage due to changes in capacitor charge following oscillator turn off.

It is accordingly an object of the present invention to provide a new and improved emitter coupled oscillator which changes state with minimal delay following oscillator startup.

It is another object of the present invention to provide a new and improved emitter coupled oscillator having minimal transient variation in frequency following oscillator start up.

It is another object of the present invention to provide a new and improved emitter coupled oscillator having a wide, programmable frequency range.

It is still another object of the present invention to provide a new and improved emitter coupled oscillator having minimal transient variation in output voltage after the oscillator is turned off.

It is a further object of the present invention to provide a new and improved emitter coupled oscillator wherein oscillation is self terminating at the next end of the an oscillation cycle following cessation of an external control signal.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DRAWINGS

FIG. 1 is a combination block and schematic diagram of an emitter coupled oscillator according to the present invention, and FIG. 2 is a schematic diagram showing in more detail the emitter coupled oscillator of FIG. 1.

DETAILED DESCRIPTION

Figure 1:
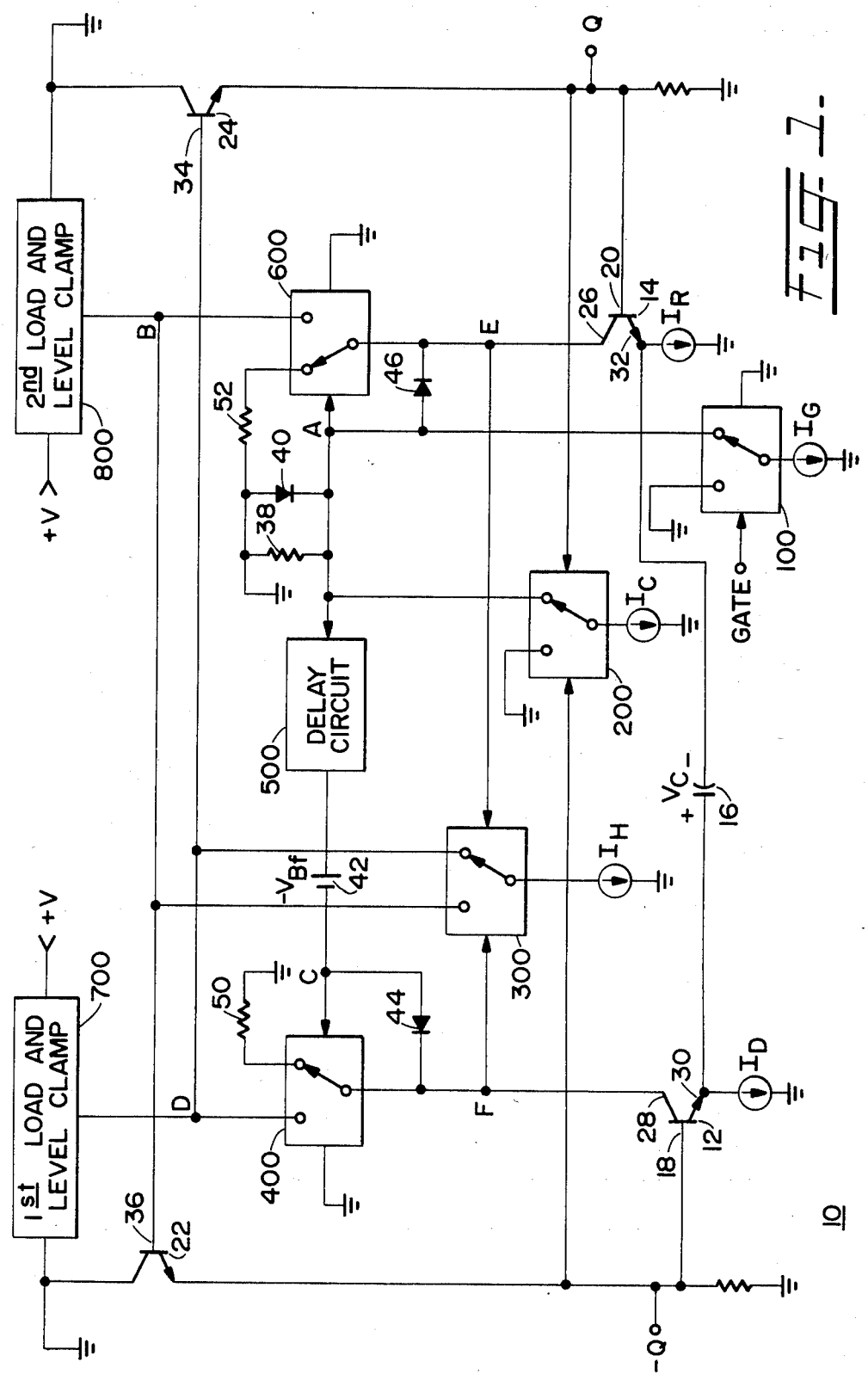

Referring to FIG. 1 illustrating emitter coupled oscillator according to the present invention in block and schematic diagram form, oscillator 10 comprises transistors 12 and 14 having emitters coupled through capacitor 16. Base 18 of transistor 12 is coupled in a feedback loop through the base/emitter junction of transistor 22 and switch 600 to the collector 26 of transistor 14. Switch 600 is shown in its non-energized position, coupling collector 26 of transistor 14 to ground through resistor 52.

Similarly, base 20 of transistor 14 is coupled in a second feedback loop through the base/emitter junction of transistor 24 and through switch 400 to collector 28 of transistor 12. Switch 400 is also shown in its non-energized position, coupling collector 28 of transistor 12 to ground through a resistor 50. Emitter 30 of transistor 12 is connected to current source ID while emitter 32 of transistor 14 is connected to current source IR. Oscillator output signal Q appears at base 20 of transistor 14 (the emitter of transistor 24) while an inverted oscillator output signal −Q appears at base 18 of transistor 12 (or the emitter of transistor 22).

When the control input to switch 600 at node A is driven to a low voltage level, switch 600 changes state thereby coupling collector 26 of transistor 14 to node B at base 36 of transistor 22. Similarly, when the control input to switch 400 at node C is driven to a low voltage level, switch 400 changes state thereby coupling collector 28 of transistor 12 to node D at base 34 of transistor 24.

When the voltages at nodes A and C are both high, switches 600 and 400 break the feedback loops coupling the opposing bases and collectors of transistors 12 and 14 as shown in FIG. 1. Oscillator 10 is then in the "off" state (not oscillating) and both transistors 12 and 14 are continuously on. On the other hand, with both nodes A and C driven low, energizing switches 600 and 400, the feedback loops connecting base 20 of transistor 14 to collector 28 of transistor 12, and connecting base 18 of transistor 12 to collector 26 of transistor 14, are closed. Oscillator 10 then changes to the "on" state whereby transistors 12 and 14 alternately switch on and off.

The switch 600 control voltage at node A is controlled by operation of gate switch 100. In the non-energized state, as shown in FIG. 1, switch 100 couples current source IG to ground. When a control voltage is applied to the gate terminal of switch 100, the switch changes state coupling current source IG to node A. The voltage at node A falls due to a resulting voltage drop across load resistor 38, wherein the size of the voltage drop at node A is limited by the junction voltage of diode 40 coupling node A to ground. When the voltage on node A is thus pulled down, switch 600 immediately changes state to complete the collector 26 to base 18 feedback loop. As the voltage of node A is driven low, the voltage of node C, coupled to node A through delay circuit 500 and voltage source 42, is also driven low after a short delay caused by delay circuit 500. With the voltage at node C low, switch 400 changes state to complete the collector 28 to base 20 feedback loop. With both feedback loops closed, normal oscillation of oscillator 10 may then begin. Oscillator 10 is thus switched on by applying a voltage to the gate terminal of switch 100.

Initially, gate switch 100 and switches 400 and 600 are not energized and transistors 12 and 14 are both on, with most of the current of source ID being drawn by transistor 12 from ground through switch 400, and with most of the current of source IR being drawn by transistor 14 from ground through switch 600. Switch 300 is provided to initialize the −Q output voltage at base 18 of transistor 12 to a high logic level while initializing the Q output voltage at base 20 of transistor 14 to a low logic level. Switch 300 has two states with the current state being determined by the difference between the voltages of two control inputs to switch 300, one input being tied to collector 26 of transistor 14 at node E and the other input being coupled to collector 28 of transistor 12 at node F. If node E is at a higher voltage than node F, then switch 300 couples current source IH to node D. If node F is at a higher voltage than node E, then switch 300 couples current source IH to node B. Biasing voltage source 42 interposed between nodes A and C ensures that when oscillator 10 is in the off state, node E is at a higher voltage than node F so that switch 300 will couple current source IH to node D.

Node F is coupled to node C by diode 44 and node E is coupled to node A by diode 46. When oscillator 10 is off, node C is at a higher voltage than node F while node A is at a higher voltage than node E, nodes E and F having been drawn low by current sources ID and IR. Therefore both diodes 44 and 46 are forward biased and the voltage difference between point E and F is equal to the bias voltage VB of voltage source 42.

Thus when oscillator 10 is off, current source IH drives node D to a selected low voltage level, limited by first load and level clamp 700 coupled between node D and ground. At the same time, second load and level clamp 800, coupled between node B and voltage source +V, drives node B to a selected high voltage level. Since transistors 22 and 24 are both on, the voltages of the −Q and Q oscillator outputs are lower than the voltages of nodes B and D by the small drop across the forward biased base/emitter junctions of transistors 22 and . 24. With load and level clamps properly adjusted, oscillator outputs −Q and Q will be maintained at the proper high and low output logic voltage levels respectively while oscillator 10 is off. Since transistors 12 and 14 are both on when oscillator 10 is off, the voltage VC across capacitor 16 is constant and equal to the difference between the high and low output voltage levels of −Q and Q at the bases of transistors 12 and 14.

When a voltage is applied to the gate terminal of switch 100, changing the switch state to couple source IG to node A, switch 600 changes state to couple node E to node B. Switch 400, however, does not immediately change state because a voltage drop at node C is delayed by delay circuit 500. In the meantime, node B, which was at a high voltage level, is immediately pulled down by current source IR to a selected low voltage level determined by second load and level clamp 800 coupled between node B and ground, and this drives output voltage −Q low shutting off transistor 12. Node F, no longer coupled to current source ID through transistor 12, rises to a higher voltage than node E, causing switch 300 to change state, thereby coupling source IH to node B and disconnecting source IH from node D. With node D disconnected from source IH, first load and level clamp 700 pulls node D to a higher voltage, thereby driving output Q to a high logic level. Transistor 14 remains on. The drop in voltage at node A eventually causes a drop in voltage at node C bringing about a change of state in switch 400 to couple node F to node D.

Thus when the gate of switch 100 is energized, the −Q and Q outputs of oscillator 10 rapidly change state, with −Q going from high to low and Q going from low to high. The initial change of state is delayed primarily by the switching times of switches 100 and 600 and transistor 12, which may be small compared to the period of oscillation of oscillator 10. The initial change of state is unaffected by the initial charge on capacitor 16.

Oscillator 10 now operates in a manner similar to a conventional emitter coupled oscillator. With transistor 12 off, current source ID draws charge from capacitor 16 until the magnitude of the voltage across capacitor 16 reaches −VC. At that point the voltage at emitter 30 of transistor 12 is low enough to turn on transistor 12. Transistor 14 is turned off through the collector 28-base 20 feedback loop which aids transistor 12 to turn on through the collector 26-base 18 feedback loop. Therefore oscillator 10 changes state, node B going high to drive the −Q output high and node D going low to drive the Q output low. Current source IR then begins to reverse the charge on capacitor 16 leading to a subsequent oscillator 10 change of state. In this way the oscillator continues to oscillate. The period of oscillation may be increased by decreasing the current drawn by current sources ID and IH or may be decreased by increasing the current of the two sources. Also the duty cycle, the portion of the oscillation period that output Q is high, may be increased by decreasing IR relative to ID or decreased by increasing IR relative to ID. Therefore the period and duty cycle of oscillator 10 are both programmable.

The initial voltage VC on capacitor 16 at the time the oscillator is turned on is approximately . equal to the peak voltage on the capacitor at the moment of oscillator change of state when oscillator 10 is oscillating. The voltages at the emitters of transistors 12 and 14 are adjusted, with both transistors on in the initial state, so that the difference therebetween is substantially equal to that encountered at the oscillator switching point. Had the charge on capacitor 16 been larger than the aforementioned peak value the first few periods of oscillation would have been longer than the steady state period of oscillation because the excess initial charge in capacitor 16 would delay the second and subsequent changes of oscillator state. The initial longer periods of oscillation would eventually approach a steady state value as the excess energy initially stored in capacitor 16 is dissipated by inherent losses in the system. Similarly, if the initial charge on capacitor 16 was lower than the peak switching value, the first few periods of oscillation would be shorter than the steady state oscillation period. However, oscillator 10 changes state quickly after gate switch 100 is energized and the first and subsequent periods of oscillation are of uniform length, there being no initial transients in the period of oscillation.

In addition to fixing the output state of oscillator 10 when output 10 is off, switch 300 and current source IH also permit oscillator 10 to operate at low frequencies. As oscillator 10 oscillates, the voltage between nodes E and F changes polarity causing switch 300 to change from state to state, connecting current source IH alternately to nodes B and D. The current from source IH alternately assists the currents from sources ID and IR in drawing down nodes B and D to the proper low levels. Therefore, ID and IR can be made very small when a long period of oscillation is desired without affecting the low logic level of outputs −Q and Q.

To turn off oscillator 10, the control voltage applied to switch 100 is removed allowing switch 100 to change state, grounding current source IG. This allows the voltage on node A to rise permitting switch 600 and then switch 400 to change state breaking the feedback loops coupling the emitters and bases of transistors 12 and 14. The voltage between nodes E and F returns to VB as set by bias voltage source 42 causing switch 300 to couple current source IH to node D if switch 300 is not already doing so. Thus oscillator 10 returns to its normal off state with output −Q at the high logic level and output Q at the low logic level.

Completion switch 200 is provided to insure that the last oscillation cycle of oscillator 10 is not prematurely terminated when the control voltage is removed from the gate of switch 100. The control inputs of switch 200 sense the potential difference between the −Q and Q oscillator outputs. If output −Q is in the high state and output Q is in the low state, switch 200 grounds current source IC. If the Q output voltage is in the high logic state and the −Q output voltage is in the low logic state, switch 200 couples current source IC to node A. Therefore, if the control voltage on gate switch 100 is removed while the Q output is still high, current source IC will continue to hold down the voltage on node A until oscillator 10 changes state driving −Q high and Q low. Therefore the last period of oscillation is of the same duration as the previous periods of oscillation and the charge on capacitor 16 reaches VC just as the oscillator turns off. In the absence of such a completion switch mechanism, turning the gate switch control voltage off at the wrong moment could leave the charge on capacitor 16 in an unstable state causing an undesirable damped oscillation in the −Q and Q output voltage levels until the charge on capacitor 16 stabilizes to a steady state value VC.

Figure 2:
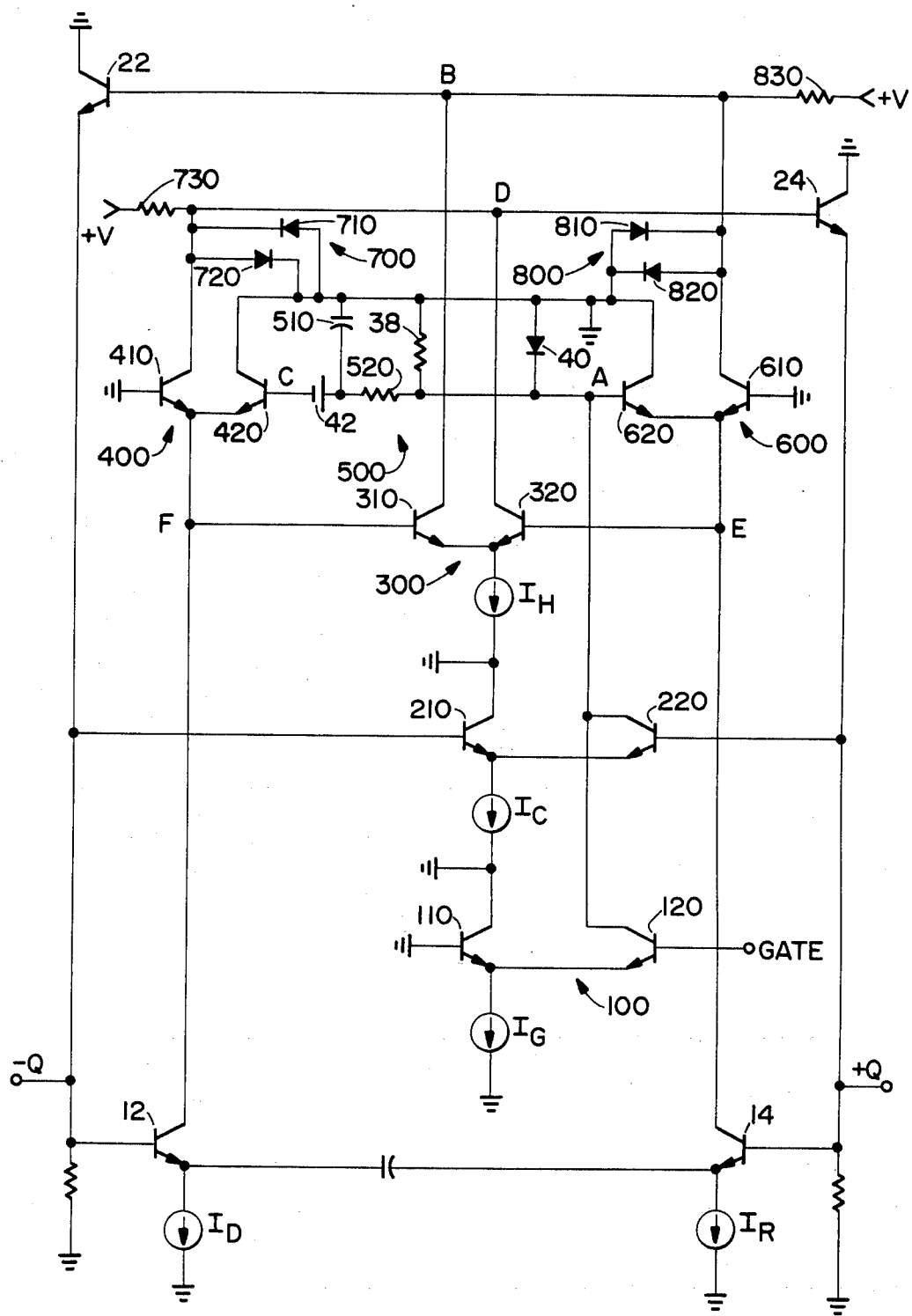

FIG. 2 depicts an oscillator similar to that shown in FIG. 1 with blocks 100-800 implemented with discrete components. Gate switch 100 is a differential amplifier comprising transistors 110 and 120. The collector of transistor 110 is grounded while the collector of transistor 120 is coupled to node A. The emitters of transistors 110 and 120 are both terminated by current source IG. A high voltage on the gate input at the base of transistor 120 will turn on transistor 120, and raising the voltage at the emitter of transistor 110 will turn off transistor 110. When the gate voltage is set to ground level, transistor 120 turns off and transistor 110 turns on. Thus switch 100 of FIG. 2 has two states and switches from state to state in the same manner as switch 100 of FIG. 1.

Completion switch 200 is also a differential amplifier comprising transistors 210 and 220. The collector of transistor 210 is grounded while the collector of transistor 220 is coupled to node A. The emitters of transistors 210 and 220 are both terminated at current source IC. The base of transistor 210 is coupled to the −Q oscillator output while the base of transistor 220 is coupled to the Q oscillator output. When Q is high, transistor 220 is on and transistor 210 is off, thereby coupling current source IC to node A. Alternately when −Q is high, transistor 220 is off and transistor 210 is on, thereby grounding current source IC.

Switch 300 comprises transistors 310 and 320. The collector of transistor 310 is coupled to node B while the collector of transistor 320 is coupled to node D. The emitters of transistors 310 and 320 are both tied to current source IH. The base of transistor 310 is coupled to node F while the base of transistor 320 is coupled to node E. When node E is higher than node F transistor 320 is on and transistor 310 is off thereby coupling current source IH to node D. Alternately when node F is at a higher voltage than node E transistor 320 is off and transistor 310 is on thereby coupling current source IH to node B.

Switch 400 includes transistors 410 and 420. The collector of transistor 410 is coupled to node D while the collector of transistor 420 is grounded. The emitters of transistors 410 and 420 are both tied to node F. The base of transistor 410 is grounded while the base of transistor 420 is coupled to node C. When node C is at a higher voltage than ground, transistor 420 is on and transistor 410 is off thereby coupling node F to ground. Alternately when the node C voltage is pulled below ground level transistor 420 is off and transistor 410 is on thereby coupling node F to node D. The base/emitter junction of transistor 420 performs the function of diode 44 of FIG. 1 and the collector/emitter impedance of transistor 420 performs the function of resistor 50 of FIG. 1.

Delay circuit 500 of FIG. 2 comprises resistor 520 coupling the high side of bias voltage supply 42 to node A and capacitor 510 coupling the high side of bias voltage supply 42 to ground. Capacitor 510 must discharge before a drop in voltage at node A is reflected at node C and therefore voltage changes at node C lag voltage changes at node A.

Switch 600 comprises transistors 610 and 620. The collector of transistor 610 is coupled to node B while the collector of transistor 620 is grounded. The emitters of transistors 610 and 620 are both tied to node E. The base of transistor 610 is grounded while the base of transistor 620 is coupled to node A. When the voltage at node A is higher than ground, transistor 620 is on and transistor 610 is off thereby coupling node E to ground. Alternately when the node A voltage is drawn down below ground level transistor 620 is off and transistor 610 is on thereby coupling node E to node B. The base/emitter junction of transistor 620 performs the function of diode 46 of FIG. 1 and the collector/emitter impedance of transistor 620 performs the function of resistor 52 of FIG. 1.

First load and level clamp 700 in FIG. 2 includes resistor 730 coupling positive voltage source +V to node D with reverse connected diodes 710 and 720 coupling node D to ground. Diode 720 prevents the voltage on node D from rising above ground by more than the forward junction voltage of the diode. Similarly diode 710 prevents the voltage on node D from falling below ground by more than the forward junction voltage of diode 710. Voltage source +V brings the voltage up to the high limit whenever node D is not coupled to a current source.

Similarly, second load and level clamp 800 comprises resistor 830 coupling positive voltage source +V to node B with reverse connected diodes 810 and 820 coupling node B to ground. Diode 820 prevents the voltage on node B from rising above ground by more than the forward junction voltage of the diode. Similarly diode 810 prevents the voltage on node B from falling below ground by more than the forward junction voltage of diode 810. Voltage source +V brings the voltage up to the high limit whenever node B is not coupled to a current source.

Thus the oscillator circuit of FIG. 2 operates in the same manner as the circuit of FIG. 1. Oscillator operation begins by changing state almost immediately upon application of a control voltage to the gate of switch 100 and ends only at the end of the current oscillation cycle following removal of the control voltage from the gate of switch 100. The charge on capacitor 16 at the beginning and at the completion of oscillator operation is approximately equal to the charge at the moment of oscillator change of state during normal, steady state operation, thereby minimizing transient variations in oscillator period following oscillator startup and also minimizing transient variations in the output voltages following oscillator shutdown.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A multistable circuit comprising:
   a pair of active elements,
   first means for coupling said active elements in feedback relation to cause said active elements to alternately switch on and off in oscillatory fashion, and including frequency determining means in circuit between said active elements effective for determining the frequency of oscillation, and
   switching means for disabling the feedback normally provided by said first means and returning said active elements to points of reference potential in order to preset a non-oscillatory state of conduction by said active elements wherein said frequency determining means is held at a voltage level corresponding to the voltage level associated therewith when said active elements are about to switch during oscillation whereby resumption of oscillation can subsequently take place at a predetermined point in the oscillation cycle.

2. The circuit as in claim 1 including further switching means adapted to sense the states of said active elements and connected for preventing operation of the first mentioned switching means until a given set of states of said active elements is reached to prevent premature interruption of the oscillation thereof.

3. An oscillator comprising:
   a first and a second transistor having their emitters coupled by a capacitor,
   a first current source coupled to the emitter of the first transistor,
   a second current source coupled to the emitter of the second transistor, and
   switching means having a first state coupling the collector of the first transistor to the base of the second transistor and coupling the collector of the second transistor to the base of the first transistor, and a second state decoupling the collectors of the first and second transistors from the respective transistor bases such that when the switching means is in the first state, the first and second transistors switch on and off in alternating fashion and when the switching means is in the second state the first and second transistors remain on continuously.

4. An oscillator comprising:
   a first and a second transistor having their emitters coupled by a capacitor,
   a first current source coupling the emitter of the first transistor to ground,
   a second current source coupling the emitter of the second transistor to ground,
   switching means having a first state coupling the collector of the first transistor to the base of the second transistor and coupling the collector of the second transistor to the base of the first transistor, and a second state coupling the collectors of the first and second transistors to ground such that when the switching means is in the first state, the first and second transistors switch on and off in alternating fashion and when the switching means is in the second state the first and second transistors remain on continuously, and
   means to hold the base of the first transistor at a high logic level and to hold the base of the second transistor at a low logic level while the switching means is in the second state.

5. An oscillator as in claim 4 further comprising means to sense the switching state of the first and second transistors and to couple a third current source to the collector of the first transistor while the second transistor is off and to couple the third current source to the collector of the second transistor while the first transistor is off.

6. An oscillator as in claim 4 further comprising means to sense the voltages on the bases of the first and second transistors and to prevent the switching means from switching from the first to the second state until the base of the first transistor is at a higher voltage level than the base of the second transistor.

7. An oscillator comprising:
   a first and a second transistor having their emitters coupled by a capacitor,
   a first current source coupling the emitter of the first transistor to ground,
   a second current source coupling the emitter of the second transistor to ground,
   switching means having a first state coupling the collector of the first transistor to the base of the second transistor and coupling the collector of the second transistor to the base of the first transistor, and a second state coupling the collectors of the first and second transistors to ground such that when the switching means is in the first state, the first and second transistors switch on and off in alternating fashion and when the switching means is in the second state the first and second transistors remain on continuously, and
   means to couple a third current source to the collector of the first transistor while the second transistor is off and to couple the third current source to the collector of the second transistor while the first transistor is off.

8. An oscillator as in claim 7 further comprising means to sense the voltages on the bases of the first and second transistors and to prevent the switching means from switching from the first to the second state until the base of the first transistor is at a higher voltage level than the base of the second transistor.

9. An oscillator comprising:
   a first and a second transistor having emitters coupled by a capacitor,
   a first current source coupling the emitter of the first transistor to ground,
   a second current source coupling the emitter of the second transistor to ground,
   switching means having a first state coupling the collector of the first transistor to the base of the second transistor and coupling the collector of the second transistor to the base of the first transistor, and a second state coupling the collectors of the first and second transistors to ground such that when the switching means is in the first state, the first and second transistors switch on and off in alternating fashion and when the switching means is in the second state the first and second transistors remain on continuously,
   means to hold the base of the first transistor at a high logic level and to hold the base of the second transistor at a low logic level while the switching means is in the second state,
   means to couple a third current source to the collector of the first transistor while the second transistor is off and to couple the third current source to the collector of the second transistor while the first transistor is off; and means to sense the voltages on the bases of the first and second transistors and to prevent the switching means from switching from the first to the second state until the base of the first transistor is at a higher voltage level than the base of the second transistor.

10. An oscillator comprising:

a first and a second transistor having emitters coupled by a capacitor, the base of the first transistor being coupled to the collector of the second and the base of the second transistor being coupled to the collector of the first, a first current source coupling the emitter of the first transistor to ground, a second current source coupling the emitter of the second transistor to ground such that the first and second transistors turn on and off in alternating fashion, and means to couple a third current source to the collector of the first transistor while the second transistor is off and to couple the third current source to the collector of the second second transistor while the first transistor is off.

* * * * *